United States Patent [19]

Hendel

[11] Patent Number: 4,810,831
[45] Date of Patent: Mar. 7, 1989

[54] HOUSING FOR AN ELECTRICAL COMPONENT, AND METHOD FOR SEALING SAME

[75] Inventor: Horst Hendel, Berlin, Fed. Rep. of Germany

[73] Assignee: Siemens-Albis Aktiengesellschaft, Zurich, Switzerland

[21] Appl. No.: 99,589

[22] Filed: Sep. 22, 1987

[30] Foreign Application Priority Data

Sep. 30, 1986 [DE] Fed. Rep. of Germany ....... 3633304
Aug. 25, 1987 [DE] Fed. Rep. of Germany ... 8711522[U]

[51] Int. Cl.⁴ .............................................. H05K 5/06
[52] U.S. Cl. .................................... 174/52.3; 264/262; 264/272.11
[58] Field of Search .................. 174/52 S, 52 PE; 335/202; 264/262, 272.11, 272.17, 272.19, 279

[56] References Cited

U.S. PATENT DOCUMENTS 4,349,693 9/1982 Hinrichs ........................ 174/52 PE
4,366,345 12/1982 Jälgle ................................ 174/52 S

FOREIGN PATENT DOCUMENTS 0127152 5/1984 European Pat. Off. .
8124847 3/1983 Fed. Rep. of Germany .
2009532 11/1978 United Kingdom .

Primary Examiner—Arthur T. Grimley
Assistant Examiner—David A. Tone
Attorney, Agent, or Firm—John Francis Moran

[57] ABSTRACT

A housing suitable for an electrical or electronic component such as a relay, including a wall having apertures (5, 6) and gaps (7) wherein distribution ribs running on the outside form with the housing surface a sharp inner edge (10). Due to these sharp inner edges, capillary action of the sealing compound is developed on the distribution ribs whereby the sealing compound is transported from a dispensing site to the apertures (5, 6) and housing gaps (7).

18 Claims, 2 Drawing Sheets

HOUSING FOR AN ELECTRICAL COMPONENT, AND METHOD FOR SEALING SAME

BACKGROUND OF THE INVENTION

This invention relates to housings for electrical components, and it relates, more particularly, to a relay or a comparable electro-mechanical component having a housing wall enclosing an inner chamber, which has sites to be sealed like apertures and gaps such as those which occur for the connection pins and/or along its edge with the housing wall. In addition, guide elements are provided for feeding the sealing compound from one or a plurality of dispensing points for proportioning the sealing compound to the sites to be sealed. In addition, the present invention further relates to a technique for sealing such housing.

In conventional housings of this kind, for example, such as one disclosed in German patent document DE-A No. 30 26 371, the distribution of the sealing compounds takes place by the capillary action of capillary channels respectively by gravity from depressed moulded dispensing sites through appropriate channels, which are located in the particular housing wall, which, as a rule, is a base plate. This, however, results in a weakening of the particular base plate, which customarily is only a few tenths of a millimeter thick anyhow, so that the thickness of the base plate from the very outset must be increased in order to ensure mechanical stability. Furthermore, the production of such capillary channels in housing walls requires relatively high expenditures in so far as the raised webs in the injection moulding die required for this process are relatively labor intensive. Moreover, capillary channels do not lead to secure sealing of all housing apertures at least not if these apertures are spaced relatively far apart and the capillary channels end at their edge.

SUMMARY OF THE INVENTION

It is, therefore, an object of the present invention, to improve a housing of the above mentioned kind and to provide a method for its sealing through capillary distribution of sealing compound, while allowing the housing itself and its production to be as simple as possible, in particular avoiding a disadvantageous increase of the construction height.

It is, another object of the invention, to provide a housing where the wetting capacity on its surface is increased so that a controlled distribution of the liquid is achieved without the proportioning point being hit exactly, and that excessive adhesive is distributed evenly.

The foregoing is solved in accordance with the invention by providing for the housing wall distribution ribs, which extend from the dispensing site(s) to the sealing sites and at least on one side form a sharp inner edge with the housing wall.

In a housing in accordance with the principles of the invention the capillary effect is not generated by sunken channels, but by the sharp inner edge between the particular distribution rib and the surface of the housing wall. The angle between the particular distribution rib and the surface of the housing wall is approximately 90° in the simplest design and should not be any larger since the capillary effect decreases with increasing angle. An angle smaller than 90° would even be desirable, which could be achieved with a dovetail profile of the distribution ribs. This, however, from the production point of view is extremely difficult to accomplish.

A further advantage of the invention resides in that into the injection moulding die for generating the distribution ribs only straight grooves need to be cut so that the overall production of the housing also can be simplified. In addition, the distribution ribs mean, although they are applied on the outside of the housing wall in contrast to the capillary channels, in effect no enlargement of the housing dimensions, since on the connection side of a component like a relay, as a rule spacing lugs or other projecting ribs are typically arranged, for the purpose of providing escape paths for the soldering vapors and the cleaning agents which arise in the process of soldering onto the circuit boards as well as during the subsequent cleaning. The distribution ribs provided according to the principle of the invention are by far not as high as such spacing lugs and can, at best, fulfill additionally the functions of such distance spacer elements. For example, with distribution ribs of a height between approximately 0.1 to 0.2 mm, good distribution of sealing compounds can already be achieved.

If the housing apertures have a relatively large diameter and its edge does not always lie immediately adjacent to, for instance, a connection pin, in order to improve capillary motion it can be provided that these housing apertures are enlarged funnel-shaped toward the outside and that the distribution ribs extend over the funnel surface into the aperture. In contrast to capillary channels, which in any event would end at the edge of such aperture, the capillary motion in this way can be extended over the funnel into the particular aperture. It is also possible to direct the sealing compound, led into a aperture via a distribution rib, back out of this aperture in another place of this aperture via an additional distribution rib to another aperture or housing gap.

When sealing housings with sealing compound, it is important to put sufficient sealing compound into all apertures and gaps to be sealed. The sealing compound should also be prevented from running into the housing interior and there forming a layer of glue on contacts or other movable elements. It therefore is advisable, that the apertures and gaps on the side facing the distribution ribs have rounded-off edges with a radius as large as possible and on the opposing side, i.e. on the inside of the housing, a sharp-edged edge. This method offers some ensurance that the sealing compound reaches into the funnel-shaped aperture by moving over the rounded-off edge but does not continue to flow on the opposite side of the housing wall over the sharp-edged edge, which acts as capillary barrier, into the housing interior.

In a second illustrative embodiment of the invention, an array of raised ribs on the outside surface of the bottom plate are distributed in raster-like fashion between the distribution ribs including the receiving areas or dispensing sites of the sealing compound.

This array provides a structure for the controlled distribution of the liquid compound even when the dispensing site does not receive liquid compound exactly on target. The array of ribs also serves to distribute evenly excessive liquid compound or adhesive.

In the production and sealing of a component housing of the above mentioned kind the distribution ribs are moulded on during the casting or injection moulding of the particular housing wall, thus, as a rule of a base plate or cover plate, and after assembling the component in the housing, the sealing compound is applied on the distribution ribs by drops. The distribution ribs are, for the sake of expediency, arranged in such a way that they radiate from each of the dispensing sites to the sites to be sealed. The dispensing sites, however, do not need to be moulded into the housing wall in the form of depressions, as is customary with the usual capillary channels. It is entirely sufficient to drip the sealing compound directly onto the distribution ribs without there being a special moulded dispensing site. In this connection, it is quite possible with ribs running transversely across the housing wall to drip the sealing compound anywhere on an appropriate place onto the distribution site. From the distribution site the sealing compound subsequently can be distributed further toward both sides by capillary action.

BRIEF DESCRIPTION OF THE DRAWING

The invention and its various features and advantages will become apparent upon consideration of an illustrative embodiment as described hereafter with reference to the drawing.

DETAILED DESCRIPTION

Figure 1:
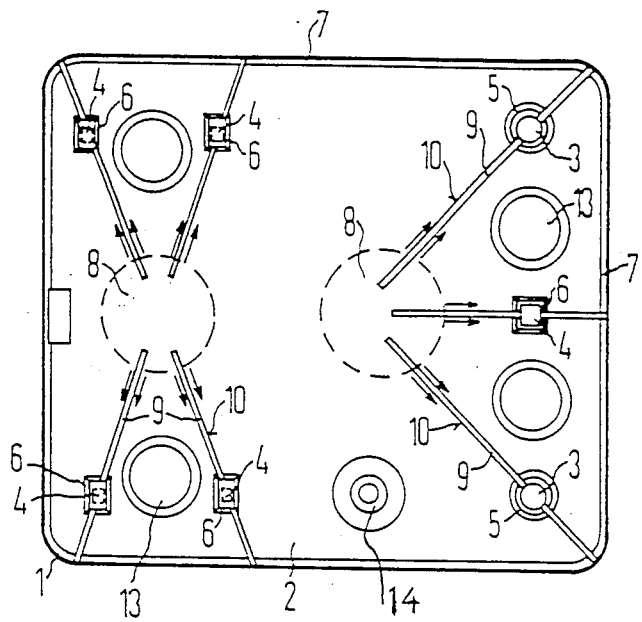
FIG. 1 is a view of the terminal side or base side of a relay.

In FIG. 1, a relay is depicted wherein only the base portion is shown including a housing with a housing cap 1 and a base plate 2. The other internal structure of the component which would be most likely a relay with respect to the invention for the most part is insignificant and is therefore not shown. The typical relay includes connection pins 3 with rounded cross sections and/or connection pins 4 with rectangular cross sections, which, in each instance, extend from the housing interior toward the outside to the connection side of the relay through respectively adapted rounded apertures 5 and rectangular apertures 6 of the base plate 2. In addition, there is an edge gap 7 between the base plate 2 and the edge 1a of the housing cap 1. This encircling edge gap 7 is also to be sealed with sealing compound similar to those of the previously mentioned apertures 5 and 6 of the connection pins.

Since it would be awkward to bring the sealing compound directly into the individual apertures 5, 6 and gap 7, and would, in particular, carry with it the danger of contaminating the connection pins with insulating sealing compound, sealing compound drops 8 are applied at readily accessible dispensing sites, which are, however, not specially moulded, to the base plate 2. From every dispensing site radiating distribution ribs 9 extend, directed to the individual housing openings 5 and 6 respectively to the edge gap 7. These distribution ribs 9 form a sharp inner edge 10 opposite the surface of the base plate 2. In a miniature relay they can, for example, have a height on the order of magnitude of 0.1 to 0.2 mm. Along these edges, the sealing compound applied in drops distributes itself through capillary action to the intended sites with the direction of flow of the sealing compound in FIGS. 1 and 2 as indicated by arrows. In the illustrative embodiment, the flow paths 11 lead from a dispensing site respectively from a drop 8 via the particular distribution ribs 9 to the individual apertures 5 and 6 with the associated connection pins 3 and 4 and from there further from these apertures 5 and 6 to the edge gap 7. In the edge gap, the sealing compound spreads itself through the known capillary action present there. Differing from the illustrative embodiment presented in FIG. 1, a distribution rib 9 could, of course, also be directed directly from a drop 8 to the edge gap 7.

Figure 2:
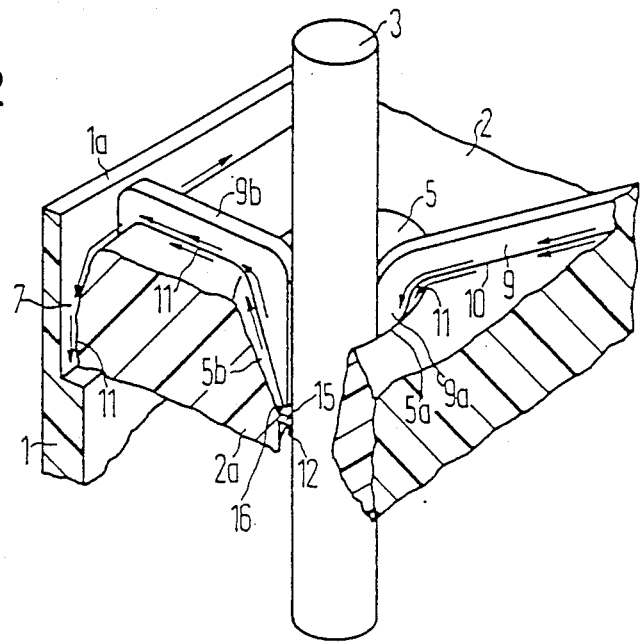
FIG. 2 shows an enlarged section of a base part of the relay of FIG. 1 in perspective.

In FIG. 2, the special design of distribution ribs 9 in the region of an aperture 5 respectively of the edge gap 7 is shown enlarged. In order to ensure good capillary guidance of the sealing compound into the aperture 5, this aperture 5 is funnel-shaped with the edge pointing to the outside having as large a radius as possible. Over this rounded-off edge 5a, the distribution rib 9 extends with its bent section 9a. In this way, the sharp inner edge necessary for capillary action extends between the distribution rib 9 and the base plate 2 into the funnel-shaped aperture without the rounded-off edge 5a hindering the flow. Sharp outer edges, however, represent a capillary barrier. Such capillary barrier is, for example, required at the inner surface of the base plate in order to prevent continuing flow of the sealing compound from the aperture 5 into the housing interior. For this purpose, a sharp edge 12 in the region of the inside 2a of the base plate 2 is formed. Sharp edge 12 interrupts the flow path for the sealing compound and prevents the continued flow into the housing interior.

It is clear from FIG. 2 that the sealing compound, which flows via the distributor rib and its bent section 9a into the aperture, is led out again by the further distribution rib 9b and guided further to the edge gap 7. Through capillary action at the sharp inner edge 10 some height difference can also be overcome.

In FIG. 2, the edge 12 at the under side of a thin partition wall 15 is shown. This arrangement provides a seal that adapts to the connection pin 3. This partition wall can lie in the partition plane of the injection moulding die and can perhaps also close off the aperture 5 as closed injection membrane if this aperture does not need to receive connection pins in the event the relay is equipped with few contact pieces. As can be seen in FIG. 2, the rib 9b ends on the upper side of the partition wall by forming a sharp inner edge, in addition, the funnel surface forms with the partition wall an encircling sharp inner edge 16. In this way, the sealing compound, which flows into the funnel-shaped aperture 5 along a distribution rib 9, is also distributed by capillary action along the inner edge 16 over the entire circumference of the aperture 5, even if no connection pin 3 is provided. In this case too, the sealing compound can be thus guided from rib 9 over the aperture 5 to rib 9b and out of the aperture 5. The aperture itself is also sealed in every case.

By applying several distribution ribs in close proximity parallel to each other, the distributing capacity of the sealing compound can be adapted to the particular requirements. Of importance for uniform distribution of the sealing compound is possibly the application of suitable flow barriers in critical regions, as has been shown in the case of the edge 12. What should be accomplished with such flow barriers is that involuntary partial withdrawal of the sealing compound is prevented, which would disrupt the uniformity of the capillary gradient and thus impair uniform distribution. It should be pointed out again, that in general, good flow barriers are formed by sharp outer edges, which can only unfold their full effect if they are closed off and do not border on sharp inner edges which, in turn, have good capillary action. In FIG. 1, it is pointed out that there on the base plate additional spacing knobs 13 are provided which permit the soldering vapors to escape while the relay is fastened on a circuit board. These spacing knobs 13 are as a rule higher than the distribution ribs 9 so that the latter effectively do not increase the relay height. The sealing compound is cured in a conventional manner. In FIG. 1, additionally, a ventilation opening 14 is indicated, which, after sealing the housing and after curing the sealing compound, may be closed in the customary manner.

Figure 3:
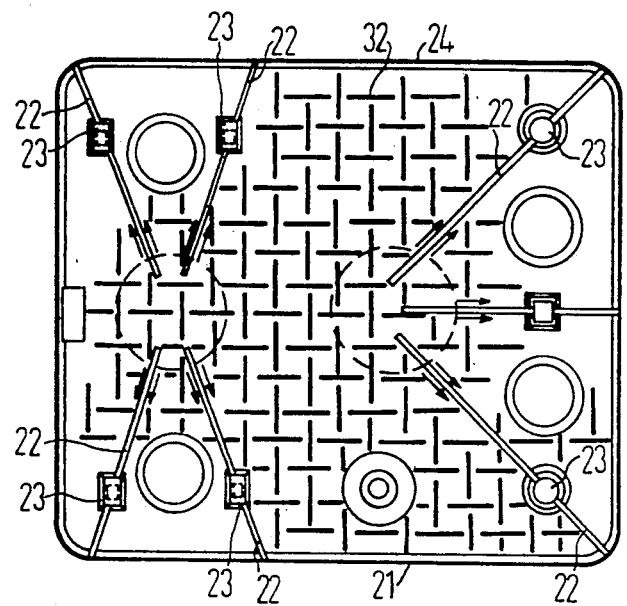
FIG. 3 depicts a modified bottom plate of a housing in accordance with the invention.

FIG. 3 provides a second illustrative embodiment similar to that of FIG. 1 wherein the corresponding elements are preceded by two, e.g. 23 instead of 3. In FIG. 3, the bottom plate 21 includes distribution ribs 22 which convey a liquid compound to openings 23 to be sealed and similarly to a peripheral edge 24. Over the entire surface, additional ribs 32 are also distributed in raster fashion.

Figure 4:
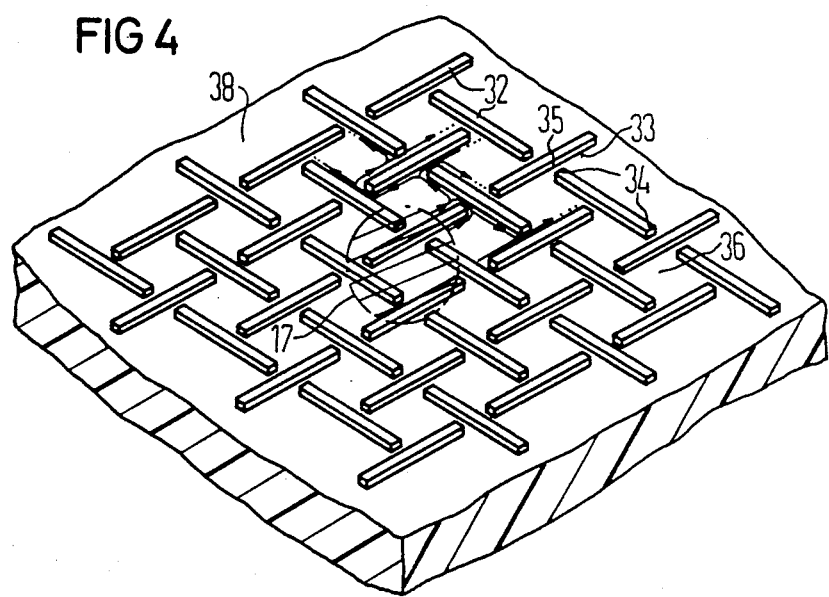
FIG. 4 is a partially sectional view of an enlarged portion of FIG. 3.

FIG. 4 illustrates an enlarged detail of the bottom plate 21 with the ribs 32 integrally formed thereon. The ribs 32 have a transition 33 with sharp edges to the bottom plate 21. At least one end 34 of the rib is oriented toward the sidewall 35 of an adjacent rib 32. Only a small gap 36 remains between the end 34 and the sidewall 35. At a filling point 17 a liquid compound is applied. Due to capillary action, this compound creeps along the sharp-edged transitions 33 to the ends 34 of the ribs 32 and overcomes the gap 36 to the sidewall 15 of the next rib. Thus, the liquid compound distributes itself in the described manner to the edge of the wetting zone 38. The width of gap 36 depends on the basic wettability of the material used.

In the illustrative embodiment shown, the ribs are about 1.5 mm long an about 0.1 mm high. In another design, columns of square cross-section are provided instead of the ribs. What is important for the wettability is that here is a sharp inner edge between column and housing part as well as a small distance between the columns. It is also conceivable to reduce the columns to naps. In further embodiments it would be evident for a person skilled in the art to provide raised portions, e.g. columns with a square cross-section or naps in place of the ribs.

There has thus been shown and described novel housing configurations for electrical components adapted for convenient and reliably sealing which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

I claim:

1. A housing having an inner chamber for an electrical component comprising a housing wall for covering the inner chamber, the housing wall including a plurality of apertures each for a connection pin and gap along its edge, the housing wall having guiding means for transporting sealing compound from one or several dispensing locations to the apertures to be sealed, the guiding means comprising distribution ribs on the housing wall and located to extend from at least one dispensing location to the sites to be sealed, and at least on one side of the apertures a sharp inner edge is formed with the housing wall.

2. A housing according to claim 1, wherein the apertures of the housing for sealing have an enlarged funnel-shape whose surface expands toward outside of the housing and the distribution ribs extend over the surface into each aperture.

3. A housing according to claim 2, wherein a first distribution rib extends from a dispensing location into a first housing aperture and another distribution rib leads out of the first aperture to a further location corresponding to that of an aperture or a gap.

4. A housing according to claim 1, wherein the apertures and gap on the housing wall opposite the distribution ribs at least in the region of the distribution ribs have rounded-off edges and on the opposite side of the housing wall the apertures and gap have a sharply formed edge.

5. A housing according to claim 2, wherein the apertures and gap on the housing wall opposite the distribution ribs at least in the region of the distribution ribs have rounded-off edges and on the opposite side of the housing wall the apertures and gap have a sharply formed edge.

6. A housing according to claim 3, wherein the apertures and gap on the housing wall opposite the distribution ribs at least in the region of the distribution ribs have rounded-off edges and on the opposite side of the housing wall the apertures and gap have a sharply formed edge.

7. A housing in accordance with claim 1, wherein from each dispensing location on the housing wall a plurality of distribution ribs radiate outward.

8. A housing in accordance with claim 2, wherein from each dispensing location on the housing wall a plurality of distribution ribs radiate outward.

9. A housing in accordance with claim 3, wherein from each dispensing location on the housing wall a plurality of distribution ribs radiate outward.

10. A housing in accordance with claim 4, wherein from each dispensing location on the housing wall a plurality of distribution ribs radiate outward.

11. A housing according to claim 1, wherein from a dispensing location in each instance two or more distribution ribs run parallel to each other to one or several locations to be sealed.

12. A housing according to claim 2, wherein from a dispensing location in each instance two or more distribution ribs run parallel to each other to one or several locations to be sealed.

13. A housing according to claim 3, wherein from a dispensing location in each instance two or more distribution ribs run parallel to each other to one or several locations to be sealed.

14. A housing according to claim 4, wherein from a dispensing location in each instance two or more distribution ribs run parallel to each other to one or several locations to be sealed.

15. A housing according to claim 7, wherein from a dispensing location in each instance two or more distribution ribs run parallel to each other to one or several locations to be sealed.

16. A housing according to claim 1, wherein said guiding means comprises additional first ribs and second ribs distributed in a raster arrangement over a region to be wetted on the housing wall by the sealing compound and wherein a predetermined spacing is provided between an end of each first rib and a side wall of each second rib extending approximately orthogonal to the first ribs, the predetermined spacing being small to enable the liquid sealing compound to be drawn by surface tension across the predetermined space from one rib onto another rib.

17. A housing according to claim 16, wherein the ribs are arranged so that the distances travelled by the sealing compound from the dispensing location along different ribs to the region to be wetted have approximately the same length.

18. A method for sealing an electrical component in a housing including a plurality of apertures for connection pins and a gap at the edge of the housing wall to be sealed off with sealing compound by applying the sealing compound on one or several sites of the housing and transporting it by capillary action to the sites to be sealed, the method comprising the steps of: molding distribution ribs on the housing wall having sharp inner edges on the outside opposite the wall surface and applying sealing compound to the distribution ribs at the distribution sites for being transported to the sites to be sealed.

* * * * *